United States Patent [19]

Dixon, Jr.

[11] 4,342,009

[45] Jul. 27, 1982

[54] ELECTRONICALLY TUNED GUNN OSCILLATOR AND MIXER INCLUDING THE SAME

[75] Inventor: Samuel Dixon, Jr., Neptune, N.J.

[73] Assignee: The United States of America as represented by the Secretary of the Army, Washington, D.C.

[21] Appl. No.: 184,456

[22] Filed: Sep. 5, 1980

[51] Int. Cl.³ .......................... H03B 9/14; H04B 1/26
[52] U.S. Cl. ......................... 331/107 DP; 331/107 G; 331/177 R; 455/321; 455/330
[58] Field of Search ............ 331/96, 107 DP, 107 SL, 331/107 G, 117 D, 177 R; 455/318–322, 325–328, 330, 331; 333/216, 217, 223, 231, 235

[56] References Cited

U.S. PATENT DOCUMENTS

| | | | |
|---|---|---|---|
| 3,886,471 | 5/1975 | Massani et al. | 331/96 X |
| 3,986,153 | 10/1976 | Kuno et al. | 331/96 X |
| 4,016,506 | 4/1977 | Kofol | 331/96 |
| 4,053,897 | 10/1977 | Nerheim | 331/107 DP X |
| 4,259,647 | 3/1981 | Chang et al. | 331/96 |

OTHER PUBLICATIONS

Lazarus et al, "New Millimetre-Wave Receivers Using Self-Oscillating Gunn-Diode Mixers", *The Microwave Journal, Jul. 1971*, pp. 43–45.
Paul, "93 GHz Self-Mixing Gunn Oscillator", Conference: 1979 IEEE, *International Microwave Symposium Digest,* Orlando, FL 30-Apr.-2 May 1979, pp. 79–80.

Primary Examiner—Siegfried H. Grimm
Attorney, Agent, or Firm—Nathan Edelberg; Jeremiah G. Murray; Edward Goldberg

[57] ABSTRACT

The millimeter and submillimeter wavelength oscillator includes a Gunn diode coupled to a hole in a ferrite image waveguide in such a way that a portion of the waveguide acts as a resonant cavity, and oscillation results. A coil surrounding the portion of the waveguide has a variable dc current applied to it to variably magnetize the waveguide and hence correspondingly vary the oscillator frequency. By applying an RF signal to the Gunn diode, the oscillator frequency can be mixed with the RF to yield heterodyne or intermediate frequencies.

12 Claims, 4 Drawing Figures

ELECTRONICALLY TUNED GUNN OSCILLATOR AND MIXER INCLUDING THE SAME

BACKGROUND OF THE INVENTION

The field of this invention is millimeter and submillimeter waves and more particularly it relates to a tunable oscillator in this frequency range which is electronically tuned and thus requires no moving parts. The device utilizes a Gunn diode in conjunction with a dielectric image waveguide as the oscillator. The Gunn diode can be arranged to function as both an oscillator and as a mixer and thus a self-oscillating mixer with electronic tuning can be easily constructed using the teachings of this invention. Oscillator tuning is accomplished by magnetizing a region of the dielectric waveguide in the vicinity of the Gunn diode.

SUMMARY OF THE INVENTION

The structure of the invention comprises a transferred electron device (or Gunn diode) which is coupled to a dielectric image waveguide in such a way that a portion of the waveguide serves as a resonant cavity which in conjunction with the negative resistance of the Gunn diode results in oscillation. The oscillator frequency can be varied by varying the dc magnetization of the waveguide in the vicinity of the Gunn diode. The magnetization of the waveguide is accomplished by a coil wound in narrow grooves in the surface of the waveguide, or the coil can be applied by printed circuit techniques. In an illustrative embodiment of the invention, a ferrite image waveguide has a central hole running through its thickness near an end of the guide. The ground plane of the guide in the region of the hole constitutes a metallic heat sink with a threaded hole therein lined up with the waveguide hole. The Gunn diode has a threaded body constituting its cathode and it is inserted into the threaded heat sink so that its tip or anode projects into the waveguide hole where it is contacted by a pin or conductor which applies the bias voltage thereto. The portion of the guide from the Gunn device to its end forms the aforementioned resonant cavity and the tuning coil is mounted thereon. By varying the current in this coil, the actual and effective dimensions of the resonant cavity are changed with a resultant change in oscillator frequency.

Since the Gunn diode is a non-linear device it can also function as a mixer and by applying an RF signal thereto in the same frequency range as the oscillator frequency, heterodyne or intermediate frequencies can be obtained from the Gunn diode output. Thus the device can function as an electronically tune self-oscillating mixer.

It is thus an object of the present invention to provide an electronically tunable millimeter wave oscillator which is particularly adapted for use in such devices as frequency-hopped communication systems and low cost radars for missile seekers.

It is another object of this invention to provide a novel tunable oscillator comprising a Gunn diode, with a portion of a high resistivity ferromagnetic image waveguide as the resonant cavity thereof and wherein said portion of said waveguide is magnetized by means of a coil to vary the resonant frequency of said oscillator.

It is a further object of this invention to provide a novel electronically tunable millimeter wave oscillator-mixer in which a Gunn diode functions simultaneously as a part of an oscillator and as a mixer.

A still further object of this invention is to provide a millimeter wave subsystem which utilizes the bulk properties of a dielectric image waveguide to control and modulate the output frequency of an oscillator over a wide bandwidth, of the order of 300 megahertz.

Another object of the invention is to provide a millimeter wave oscillator with a remote tuning capability whereby the frequency thereof may be varied remotely without any mechanical or other moveable tuning means.

Other objects and advantages of the invention will become apparent from the following detailed description and drawings.

DETAILED DESCRIPTION OF A PREFERRED EMBODIMENT

Figure 1:
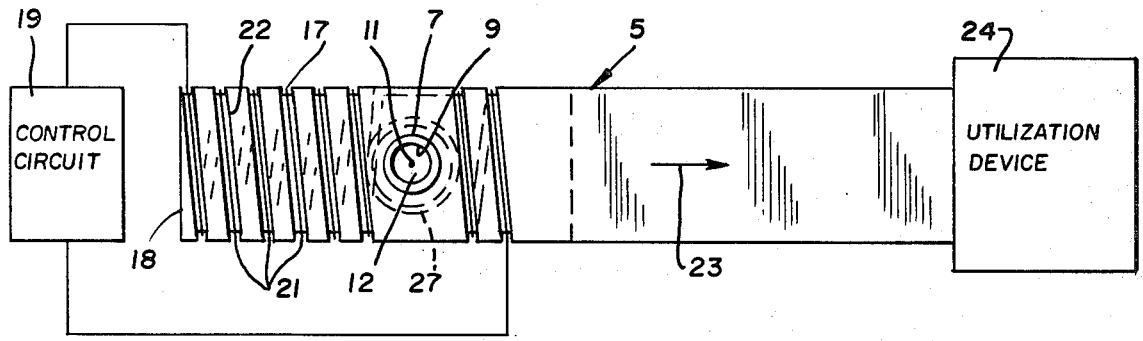
FIGS. 1 and 2 are top and side views respectively of an oscillator constructed according to the present invention.
Figure 2:
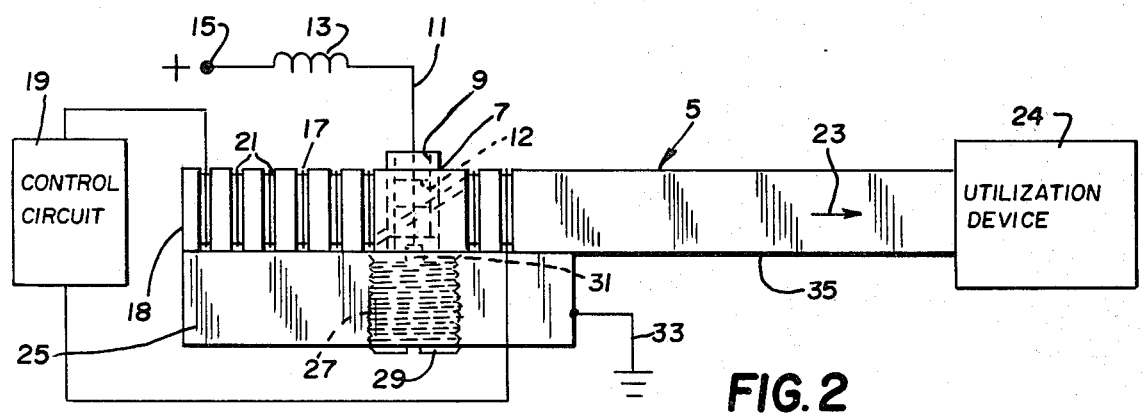

FIGS. 1 and 2 show a laboratory breadboard of an oscillator constructed according to the present invention. In these figures, 5 represents a section of high resistivity ferromagnetic dielectric waveguide of the image type. Such a waveguide includes an elongated section of the dielectric material of rectangular cross section, in which the wave propagation takes place, with a metallic ground plane in which the image of the field structure in the dielectric material is formed. The ground plane is attached to one of the broad surfaces of the rectangular waveguide. On FIGS. 1, 2, and 3 the ground plane at the left end of the guide is constituted by a block of metal 25, which functions additionally as a heat sink for the Gunn diode 29 which is mounted therein. For the remainder of the guide's length, a conductive foil 35 serves as the ground plane.

The guide has a central hole 7 running through its thickness. The heat sink 25 has a larger threaded hole 27 in it aligned with the hole 7 in the guide. The Gunn diode 29 has mating threads on its main body or cathode and it is screwed into the hole 27 so that its tip or anode 31 projects into the hole 7 in the guide. The threaded connection between the diode's cathode and the heat sink provides good electrical and thermal conductivity between these elements. The heat sink and the ground plane 35 are grounded at 33. Positive bias is applied to anode 31 from positive voltage source 15 via choke 13, lead 11 and connector 9, which is mounted within the hole 7. The Gunn diode is located a short distance from the end 18 of the waveguide 5, the exact distance being chosen as an integral number of half wavelengths of the desired oscillator center frequency. The diode bias must be chosen to provide the required negative resistance at the same frequency. With this arrangement, the region 17 of the guide between the diode and the guide end 18 will function as a resonant cavity and in conjunction with the negative resistance of the Gunn device, oscillation will take place.

The control coil 21 is wound around the cavity portion of the waveguide 5. A control circuit 19 connected to coil 21 varies the current therein to correspondingly vary the magnetization of the dielectric guide in this region. Control circuit 19 may comprise merely a source of dc voltage with a rheostat in series therewith to provide manual control of the direct current in the coil 21 and consequent frequency control of the oscillator. The control circuit may also comprise a signal generator with a complex waveform which can be adjustable to provide complex modulation of the oscillator frequency for specialized applications. The turns of the coil 21 may be wound in grooves or recesses 22 on the dielectric waveguide. This arrangement prevents the shorting out of adjacent turns by the heat sink 25. Alternatively, the coil 21 may be formed on the surface of the guide by means of printed circuit techniques. In this event it would be necessary to cover the lower broad surface of the guide or the turns 22 in this region with insulation so that the metal heat sink 25 does not short out the coil. The coil 21 extends a short distance beyond the region of the hole 7 and the Gunn diode. This feature is not strictly necessary, however by so extending the coil the magnetic field within the cavity region between the Gunn diode and the guide end 18 will be more uniform.

The oscillator output 23 travels to the right and is applied to utilization device 24, which can be an antenna, a mixer, or other load.

Figure 4:
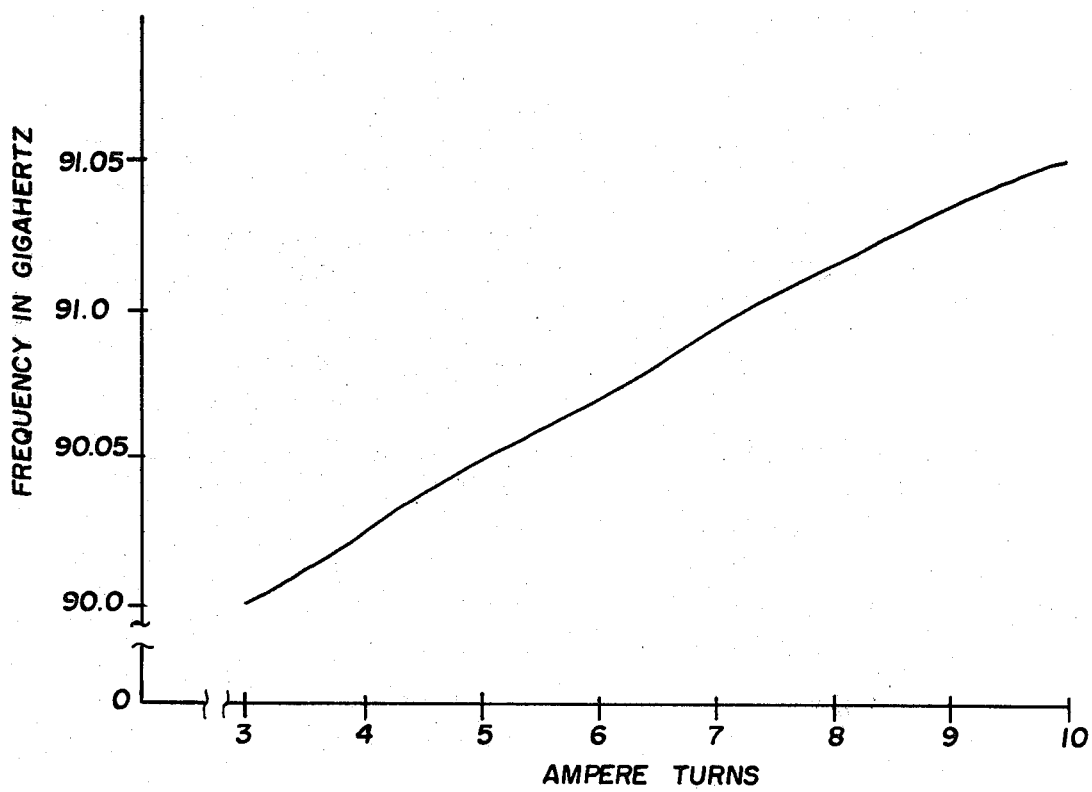
FIG. 4 is a graph showing the operating frequency of the oscillator of FIGS. 1 and 2 as a function of the magnetizing force applied to the control coil thereof.

The graph of FIG. 4 shows the frequency variation of the oscillator of FIGS. 1 and 2 as a function of the magnetizing force, H, in ampere turns applied to the coil 21. At zero magnetization, the oscillator frequency is just below 90.0 gigahertz and at 10.0 ampere turns, just below saturation of the ferromagnetic waveguide, the oscillator frequency has increased to over 91.0 gigahertz, a frequency range of over 1000 megahertz.

In the millimeter and submillimeter portion of the spectrum, high resistivity ferromagnetic materials are used as waveguides because of cost considerations and because low loss wave propagation can take place in these materials down to the submillimeter region. In ferromagnetic substances, the atoms or ions have a permanent magnetic moment sufficient to exert a strong enough field to align the neighboring magnetic dipoles, which in turn influence their neighbors. Thus all unpaired spins in a large portion of the body are oriented nearly parallel to one another. As a consequence, these portions of the material, known as domains, have a spontaneous magnetization, that is, the domains have an intrinsic magnetic moment even in the absence of an applied external field. This spontaneous magnetic moment is equal to $M_s$, the saturation magnetization at any given temperature. Ferromagnetic materials of macroscopic dimensions however have zero magnetization in the absence of an applied magnetic field because the domains are oriented randomly with respect to each other. An externally applied field will rotate all of the domains in the same direction, the direction of the applied field. When a ferromagnetic material is magnetized in this fashion, the material dimensions change as a function of the magnetization. This effect is known as magnetostriction. Magnetization also causes changes in the susceptibility of these materials. The combination of these two changes results in both actual and effective (or electrical) changes in the resonant cavity dimensions which are believed to produce the observed frequency changes in the present oscillator, as the magnetization of the cavity is varied.

Figure 3:
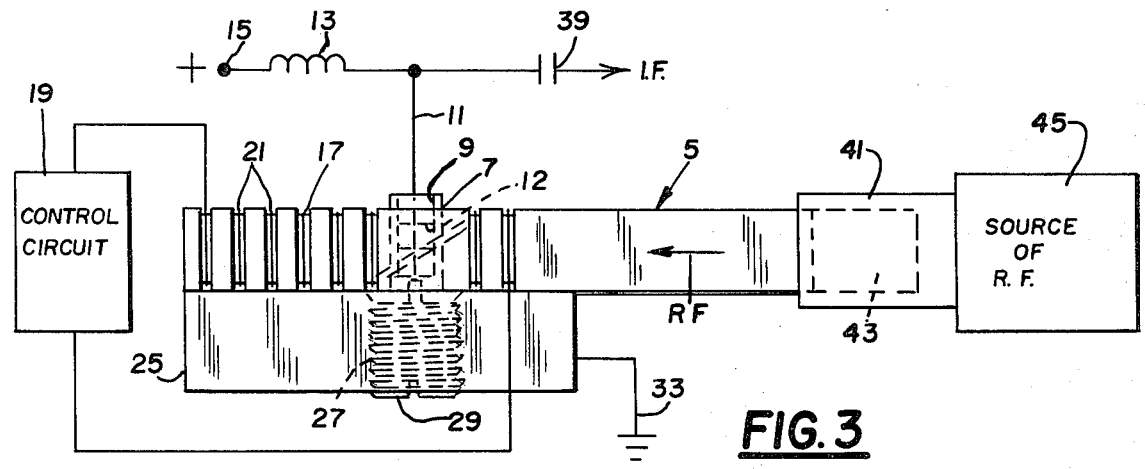
FIG. 3 is a side view of a self oscillating mixer according to the present invention.

The self oscillating mixer of FIG. 3 is the same as the oscillator of FIGS. 1 and 2 except that the utilization device 24 has been replaced with a source of radio frequency (RF) 45. RF source 45 can be a receiving antenna, or a signal generator with a frequency in the same range as that of the oscillator portion of the circuit. A conventional hollow rectangular waveguide 41 couples the output of source 45 to the dielectric waveguide 5. The end of the guide 5 is inserted a short distance into guide 41, as shown, and the end 43 of guide 5 is tapered to provide a smooth transition between the two waveguides. The end 43 of guide 5 is triangular as viewed from above, to form the tapered end. The oscillator portion of FIG. 3 including the Gunn diode 29, the waveguide 5 and the coil 21 function in the same manner as the oscillator of FIGS. 1 and 2 to produce a variable millimeter wave frequency within the Gunn diode and the adjoining region of the waveguide 5. The RF signal from source 45 is also applied across the non-linear Gunn diode and as a result of the mixing or hetrodyning action therein, sum and difference frequencies will be generated. Normally, the difference frequency is desired as the intermediate frequency, since it can be efficiently amplified by lower frequency circuitry. The connector 9 includes a pair of discs 12 centered on lead 11 which function as microwave and mm wavelength chokes and thus block signals in these frequency ranges from the IF output. The intermediate frequency is passed by this choke and is applied to the output, IF, through blocking capacitor 39.

Self oscillating Gunn type mixers have attracted considerable interest recently, because such devices can simplify all types of receiving systems. Schottky barrier and other rectifier diodes suffer from fragility and low burnout power levels. Bulk effect self oscillating mixers using the non-liniarity of the transferred electron (or Gunn) devices offer competitive sensitivities and high power handling capacity. In such circuits a separate mixer diode is unnecessary, since the Gunn device serves a dual purpose. The present oscillator-mixer has the additional advantage of remote oscillator tuning with no moving parts. The simple structure of FIG. 3 can be used as the entire front end of a mm wave receiver, with all subsequent circuitry operating at the much lower intermediate frequency. Further, the mixing process can occur with conversion gain similar to that of parametric amplifiers. Ordinary passive non-linear mixers result in losses, that is the IF signal is always less than the RF signal, and often only a small fraction thereof.

In reducing this invention to practice, monocrystalline yttrium iron garnet (YIG) was utilized as the material for the dielectric waveguide, however any high resistivity ferromagnetic material with a dielectric constant in the vicinity of 12 to 14 can be used. Many ferrites meet these requirements. The waveguide 5 had a width of 70 millimeters and height of 40 millimeters.

While the invention has been described in connection with illustrative embodiments, obvious modification thereof will be apparent to those skilled in the art. Accordingly, the invention should be limited only by the scope of the appended claims.

I claim:

1. A millimeter wavelength oscillator, comprising: a dielectric image waveguide of rectangular cross section capable of supporting millimeter wavelength propagation with low loss, a utilization device connected to one end of said waveguide, a central hole through the thickness of said waveguide near the other end thereof, a metallic heat sink attached to one broad wall of said waveguide and extending from said other end of said waveguide to beyond said hole in said waveguide, a threaded hole in said heat sink lined up with said hole in said waveguide, the remainder of said one broad wall being covered with a conductive foil, whereby said heat sink and said foil form a ground plane for said waveguide, a Gunn diode having a threaded cathode mounted in said hole in said heat sink, the anode of said diode projecting into said hole in said waveguide, said hole in said waveguide being located an integral number of half wavelengths from said other end of said waveguide at the desired center frequency of said oscillator, means to bias said Gunn diode into a negative resistance region at said desired center frequency, a coil wound around said waveguide between said hole therein and said other end thereof, and a control circuit connected to said coil.

2. The oscillator of claim 1 wherein said control circuit provides variable magnetization of said waveguide, whereby the oscillation frequency will correspondingly change.

3. A remotely tunable millimeter wavelength oscillator, comprising; a length of dielectric image waveguide with a ground plane attached to one broad wall thereof, a portion of said ground plane being constituted by a metallic heat sink extending from one end of said waveguide, a central hole through the thickness of said waveguide located approximately an integral number of half wavelengths from said one end of said waveguide at the desired operating frequency, a hole in said heat sink aligned with said hole in said waveguide, a Gunn diode mounted in said hole in said heat sink with its cathode conductively contacting said heat sink and its anode projecting into said hole in said waveguide, means to bias said Gunn diode into a negative resistance region at said operating frequency, a utilization device attached to the other end of said waveguide, and means to tune said oscillator by varying the dc magnetization of the region of said waveguide between said one end thereof and said hole therein.

4. The oscillator of claim 3 wherein said means to tune said oscillator comprises a coil wound around said waveguide between said one end thereof and said hole therein, and a control circuit connected to said coil.

5. The oscillator of claim 4 wherein said coil is disposed in grooves in the surface of said waveguide.

6. The oscillator of claim 4 wherein said coil is disposed on the surface of said waveguide by printed circuit techniques and the turns of said coil are insulated from said heat sink.

7. A mm and sub mm oscillator comprising a length of dielectric image waveguide capable of supporting low loss propagation at mm and sub mm wavelengths, a Gunn diode mounted with its anode projecting inside a hole in said waveguide near one end therein, means to bias said Gunn diode into a negative resistance region, means to vary the dc magnetization of said waveguide between said hole and said one end of said waveguide, whereby said oscillator frequency will change with changes in said magnetization.

8. The apparatus of claim 7 wherein a utilization device is connected to the other end of said waveguide.

9. The apparatus of claim 8 wherein said waveguide is formed from monocrystalline yttrium-iron-garnet.

10. An electronically tunable self-oscillating mixer operating in the millimeter wavelength portion of the spectrum, comprising; a length of ferrite image waveguide capable of low loss propagation of millimeter waves, a Gunn diode mounted with its anode in a hole in said waveguide near one end thereof, and its cathode contacting a heat sink attached to said waveguide and forming a portion of the ground plane thereof, means to bias said diode into a negative resistance region at the operating frequency, said diode being located an integral number of half wavelengths from said one end of said waveguide at said operating frequency, and means to vary the dc magnetization of said waveguide between said hole and said one end to thereby vary the oscillator frequency, means to apply an RF signal to said Gunn diode, and means to withdraw an intermediate frequency from said Gunn diode, said intermediate frequency being the difference frequency between said oscillation frequency and said RF frequency.

11. The apparatus of claim 10 further including choke means to prevent microwave and mm wave frequencies from entering the bias supply of said Gunn diode and from entering the IF output of said apparatus.

12. A tunable oscillator operating in the mm wavelength portion of the spectrum, comprising a length of high resistivity ferromagnetic image waveguide with a dielectric constant of approximately 12 to 14, a utilization device attached to one end of said waveguide, a Gunn diode having its anode disposed in a hole near the other end of said waveguide, means to bias said Gunn diode into a negative resistance region so that oscillation will take place, with the region of said waveguide between said hole and said other end thereof forming a resonant cavity, and means to tune said oscillator by varying the dc magnetization of said resonant cavity.

* * * * *